US011360388B2

(12) United States Patent
deVilliers et al.

(10) Patent No.: US 11,360,388 B2
(45) Date of Patent: *Jun. 14, 2022

(54) CRITICAL DIMENSION CORRECTION VIA CALIBRATED TRIM DOSING

(71) Applicant: Tokyo Electron Limited, Tokyo (JP)

(72) Inventors: Anton deVilliers, Albany, NY (US); Ronald Nasman, Albany, NY (US); Jeffrey Smith, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 362 days.

This patent is subject to a terminal disclaimer.

(21) Appl. No.: 16/357,946

(22) Filed: Mar. 19, 2019

(65) Prior Publication Data
US 2019/0287795 A1 Sep. 19, 2019

Related U.S. Application Data

(60) Provisional application No. 62/645,124, filed on Mar. 19, 2018.

(51) Int. Cl.
| G03F 7/20 | (2006.01) |
| H01L 21/027 | (2006.01) |
| G03F 7/095 | (2006.01) |
| H01L 21/67 | (2006.01) |

(52) U.S. Cl.
CPC ............ G03F 7/2022 (2013.01); G03F 7/095 (2013.01); G03F 7/20 (2013.01); G03F 7/2051 (2013.01); H01L 21/0274 (2013.01); H01L 21/67017 (2013.01)

(58) Field of Classification Search
None
See application file for complete search history.

(56) References Cited

U.S. PATENT DOCUMENTS

| 9,645,391 | B2 | 5/2017 | deVilliers |
| 9,645,495 | B2 | 5/2017 | deVilliers |
| 9,977,339 | B2 | 5/2018 | deVilliers et al. |
| 10,338,466 | B2 | 7/2019 | deVilliers |
| 2006/0019412 | A1 | 1/2006 | Rankin et al. |
| 2012/0214099 | A1* | 8/2012 | Chen ................. G03F 7/0045 430/283.1 |
| 2013/0078558 | A1 | 3/2013 | Hotzel |
| 2017/0010531 | A1 | 1/2017 | Park et al. |
| 2017/0242344 | A1 | 8/2017 | Carcasi et al. |
| 2017/0329229 | A1 | 11/2017 | Carcasi et al. |

OTHER PUBLICATIONS

Korean Intellectual Property Office, The International Search Report and the Written Opinion for International application No. PCT/US2019/022920, dated Jul. 2, 2019, 11 pg.

* cited by examiner

*Primary Examiner* — Kathleen Duda
(74) *Attorney, Agent, or Firm* — Oblon, McClelland, Maier & Neustadt, L.L.P.

(57) ABSTRACT

Techniques herein include processes and systems by which a reproducible CD variation pattern can be mitigated or corrected to yield desirable CDs from microfabrication patterning processes, via resolution enhancement. A repeatable portion of CD variation across a set of wafers is identified, and then a correction exposure pattern is generated. A direct-write projection system exposes this correction pattern on a substrate as a component exposure, augmentation exposure, or partial exposure. A conventional mask-based photolithographic system executes a primary patterning exposure as a second or main component exposure. The two component exposures when combined enhance resolution of the patterning exposure to improve CDs on the substrate being processed without measure each wafer.

20 Claims, 3 Drawing Sheets

CRITICAL DIMENSION CORRECTION VIA CALIBRATED TRIM DOSING

CROSS REFERENCE TO RELATED APPLICATIONS

The present application claims the benefit of U.S. Provisional Patent Application No. 62/645,124, filed on Mar. 19, 2018, entitled "Method for Correcting Critical Dimensions using Calibrated Trim Dosing," which is incorporated herein by reference in its entirety.

BACKGROUND OF THE INVENTION

This disclosure relates generally to patterning of substrates including semiconductor substrates such as silicon wafers. This disclosure also relates to processes involved with photolithography including coating and developing films on substrates as part of semiconductor device fabrication. This disclosure particularly relates to controlling dimensions and accuracy of patterned features as part of photolithography and patterning processes.

Photolithography involves coating substrates with films that are sensitive to electromagnetic (EM) radiation, exposing these films to a pattern of EM radiation to define a latent pattern within the film, and then developing the latent pattern to reveal a physical or relief pattern on the substrate. Preparation and development of such films can include thermal treatment or baking. For example, a newly applied film can require a post-application bake (PAB) to evaporate solvents and/or to increase structural rigidity or etch resistance. Also, a post-exposure bake (PEB) can be executed to set a given pattern to prevent further dissolving of films. Fabrication tools for coating substrates and developing films typically include many modules that can be used to add films, bake films, and develop films.

SUMMARY

In a conventional patterning process, a photolithography scanner exposes light (e.g. using 193 nm wavelength light) onto a mask or reticle such that a substrate coated with photoresist is exposed to a pattern of light. The photoresist can include additives to enable solubility shifting. These additives can include a photoresist acid generator (PAG) distributed evenly within the resist. The PAG in the photoresist reacts with the 193 nm light (or other selected light wavelength) and creates acid that chemically changes the reacted areas of the substrate to be developed or removed thereby creating a relief pattern having, for example, nanometer size structures made of the photoresist that remain on the substrate. Note that the reacted areas can become soluble or insoluble to a given developer depending on a tone of resist and developer selected for use.

Conventional photolithographic exposure techniques, however, are not perfect. For example, features and structures created can have undesirable critical dimensions (CDs) or variations in CDs that are not desirable or not within specified tolerances. Such undesirable CDs can cause device defects or otherwise compromise performance. CD variation across a wafer can be induced by a number of sources including temperature variation, variation in chemical composition of process chemicals, optical imperfections, and process variation, among others. These imperfections can be introduced at multiple steps, including film application, coating, masking, exposure and etch.

For a given tool set, wafer pattern, and process recipe, a resulting CD variation pattern is reproducible. Techniques herein include processes and systems by which this reproducible CD variation pattern can be mitigated or corrected to yield desirable CDs from microfabrication patterning processes. Techniques herein include processes providing a resolution enhancement technique. Such a technique includes identifying a repeatable portion of CD variation across a set of wafers and generating a correction exposure pattern. A direct-write projection system exposes this correction pattern on a substrate as a component exposure or augmentation exposure. A conventional mask-based photolithographic system executes a patterning exposure which can be considered as a primary exposure or component exposure. The two exposures together enhance resolution of the patterning exposure to improve CDs on substrates processed accordingly.

One embodiment includes a method for patterning a substrate providing resolution enhancement. A composite critical dimension signature is received that characterizes multiple substrates having been processed with a specific photolithographic exposure process. The specific photolithographic exposure process includes a mask-based photolithographic exposure. The composite critical dimension signature is created by measuring critical dimensions from the multiple substrates having been processed with the specific photolithographic exposure process and identifying repeated critical dimension values at spatial locations across the multiple substrates. A substrate is received to be processed with the specific photolithographic exposure process. The substrate is coated with a photoresist film. A first pattern of actinic radiation is projected onto the photoresist film. The first pattern of actinic radiation is projected using a maskless projection system. The first pattern of actinic radiation is created using the composite critical dimension signature. The substrate is received after having been processed with the specific photolithographic exposure process that includes the mask-based photolithographic exposure. The mask-based photolithographic exposure is a second pattern of actinic radiation projected onto the photoresist film. The substrate is developed to remove portions of the photoresist film that are soluble from the first pattern of actinic radiation and from the second pattern of actinic radiation. The resulting substrate has a relief pattern with improved CDs. Additionally, techniques herein can be used for profile tuning of CDs.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
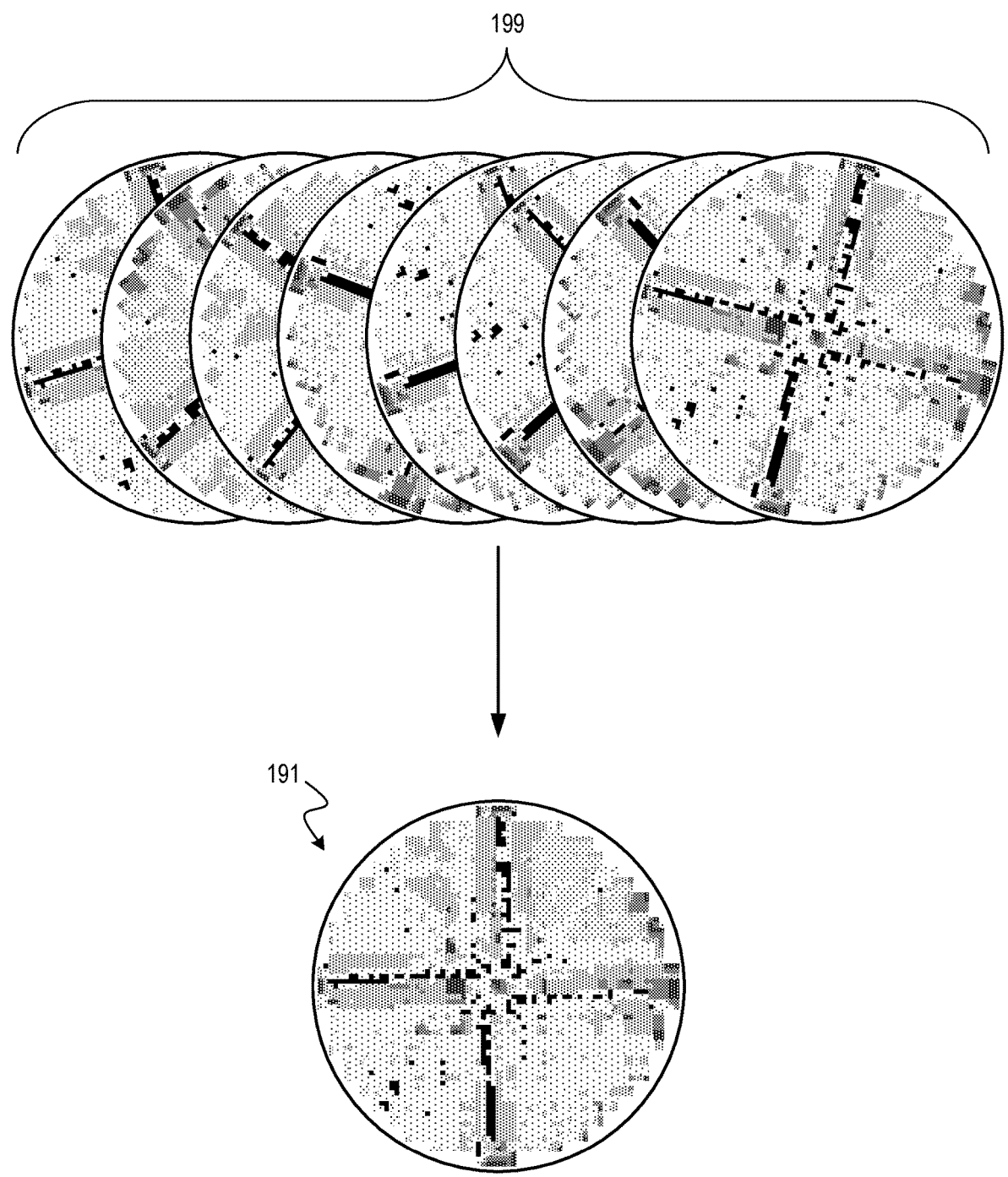
FIG. 1 is a representative illustration of composite signature generation.

Techniques herein include processes and systems by which a reproducible CD variation pattern can be mitigated or corrected to yield desirable CDs from microfabrication patterning processes. Techniques herein include processes providing a resolution enhancement technique. Such a technique includes identifying a repeatable portion of CD variation across a set of wafers and then generating a correction exposure pattern. A direct-write projection system exposes this correction pattern on a substrate as a component exposure, augmentation exposure, or partial exposure. A conventional mask-based photolithographic system executes a primary patterning exposure as a second or main component. The two component exposures when combined enhance resolution of the patterning exposure to improve CDs on the substrate being processed.

Features, such as vias and trenches, are created on substrates using various microfabrication techniques. These techniques typically include applying a film across a substrate surface, coating the substrate with resist, and exposing the resist to radiation through a photomask. Such exposure causes photo acid generators (PAGs), which are embedded in the resist, to create acid when exposed to a specific wavelength or range of wavelength of radiation. This acid weakens the resist where light is exposed (or cross-links the resist depending on the materials used). The exposed resist film can then be exposed to a developer by dispensing liquid chemicals onto the resist film. The developer specifically attacks and removes the resist that is weakened by the acid. The result is a relief pattern of resist with portions of an underlying layer now uncovered. The underlying layer can then be etched using the relief pattern as an etch mask. The resist film can be removed and then additional etching and or film forming processes can be continued.

Maintaining the critical dimension uniformity (CDU) of these features is beneficial to the electrical properties of devices that these features are used to build. As feature size progresses ever smaller, the acceptable level of deviation likewise becomes smaller. As process parameters have to be held to tighter and tighter tolerances, such tolerances go beyond the capability of conventional techniques to generate desired results.

Various degrees of improvement in CDU can be achieved using techniques such as uniformity control of the PAG concentration in the resist, application and control techniques for resist and developer, tight thermal control of the substrate (diffusion of the generated acid is a function of temperature), uniformity control of the etching plasma environment, and resolution enhancement techniques (RET) of the radiation exposure such as a phase shifting mask, off-axis illumination, optical proximity correction, and dose mapping by CD measurement and feedback for the per step dose control provided by a scanner or stepper system (mask-based exposure).

Techniques herein include providing a hybrid or dual exposure technique to enhance resolution. A direct-write projection system is used to provide a lesser portion of a total exposure dosage with very high resolution using a projected image based on (formed from) repeated patterns of CD variation.

In one embodiment, in situ metrology is used with a coater-developer (track) tool to identify a repeatable portion of across wafer CD variation (AWLV) pattern for a given lithography process or process series. This repeatable pattern is then fed to a correction algorithm that drives a direct write system that provides trim dose exposures to the resist prior to (or subsequent to) full/remaining exposure. The direct write system can be embodied as a micro mirror projection system such as a laser galvanometer or digital light projection (DLP) chip. Other beam scanning or projection systems and light valves can alternatively be used. Essentially any projection system that can project a correction pattern directly based on digital input without using a photomask. The direct write system can provide a relatively small portion of a required radiation dose. For example, a dose of 0.1 to 10% or 1-3% of a required actinic radiation dose is provided by the direct write system. Whatever dosage amount is projected by the direct write system can be subtracted from a full dose exposure. The direct write system at least provides less than 50% of a total required exposure dose.

In one embodiment, multiple substrates are processed according to a given recipe or predetermined sequence of process steps. These substrates can be processed without the use of the direct write system. This will result in a set of substrates having CD variation. This CD variation, or some portion of CD variation, will be the same across the set of substrates. Processes, materials, and tools are not perfect. There will be some random variation across substrates being processed, but some variation will be repeated. For example, a given tool might have a hot spot on its wafer chuck that modifies CDs at that hot spot across all wafers held by that particular chuck. As can be appreciated, substrates processed using that chuck can have a CD non-uniformity at a same coordinate location on the substrate. This is a repeating pattern that can be identified for correction without then needing to measure all incoming substrates. Thus, throughput can increase or remain high, while improving CDs without needing to individually measure every substrate. Once repeating patterns of non-uniformity are identified, then substrates processed on corresponding systems can be corrected without taking time to measure each substrate. In other words, expected non-uniformities can be corrected without constant measurement.

Features on initial or sample substrates are scanned or measured to determine the CD variation across each and identify a variation pattern that needs correcting. FIG. 1 shows CD signatures 199 representing a collection of CD variation maps for a set of substrates. Each substrate can have random variations, but there will also be repeating variations. The identified repeating variations are used to generate composite critical dimension signature 191. Composite critical dimension signature 191 can then map coordinate locations of repeating variations and/or provide light intensity values to correct non-uniformities at each coordinate location. Such a CD signature can be used as instructions and/or a projection image by the direct write system.

After identifying a CD variation pattern, subsequent substrates—to be processed with the same given recipe or predetermined sequence of process steps—are coated with resist according to the recipe, but while still in the track tool these substrates are exposed with a direct write system as a portion of a full exposure needed. With the direct write system, approximately 0-3% of the full exposure dose is given. Each point location or projected point location (scan point on the substrate) is fully adjustable from 0-100% of a possible intensity of a beam or beams from the direct write system. Alternatively, after an initial exposure in a mask-based photolithography tool, a processed substrate is returned to a track tool to receive a corrective dose prior to development.

Figure 2:
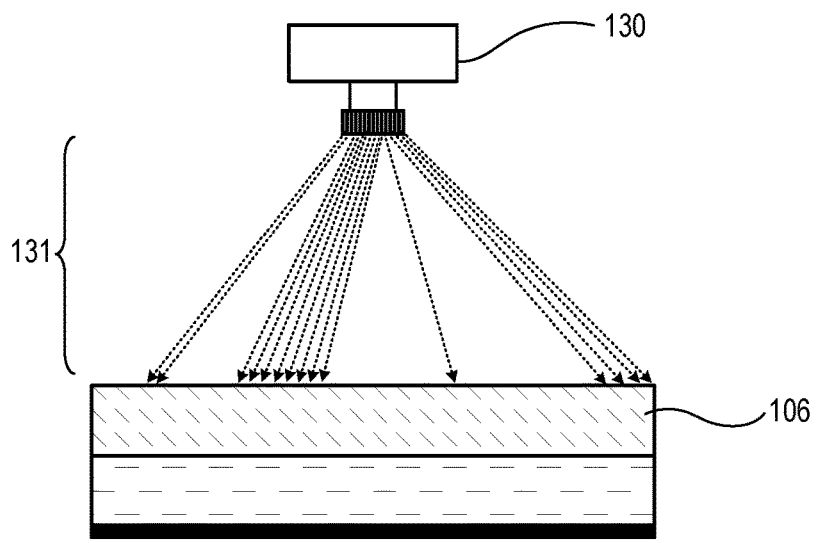
FIG. 2 is a cross sectional view an example mask-less projection system used with embodiments herein.

Based on the identified CD variation pattern (composite CD variation pattern), a composite CD signature or composite CD correction pattern is created. A correction pattern or series of correction patterns are sent to the direct write system, which increases the exposure at point locations where features are undersized and reduces or eliminates exposure where features are oversized (depending on resist tone). Accordingly intensity of projection at any point location on the substrate is adjustable from zero actinic radiation to full exposure based on corresponding available power of the direct write system, or any gradation of light intensity in between. FIG. 2 illustrates an example cross-sectional drawing of an example direct write system 130. Pattern 131 being projected onto photoresist film 106 can vary in amount of radiation per coordinate location based on composite critical dimension signature 191.

Figure 3:
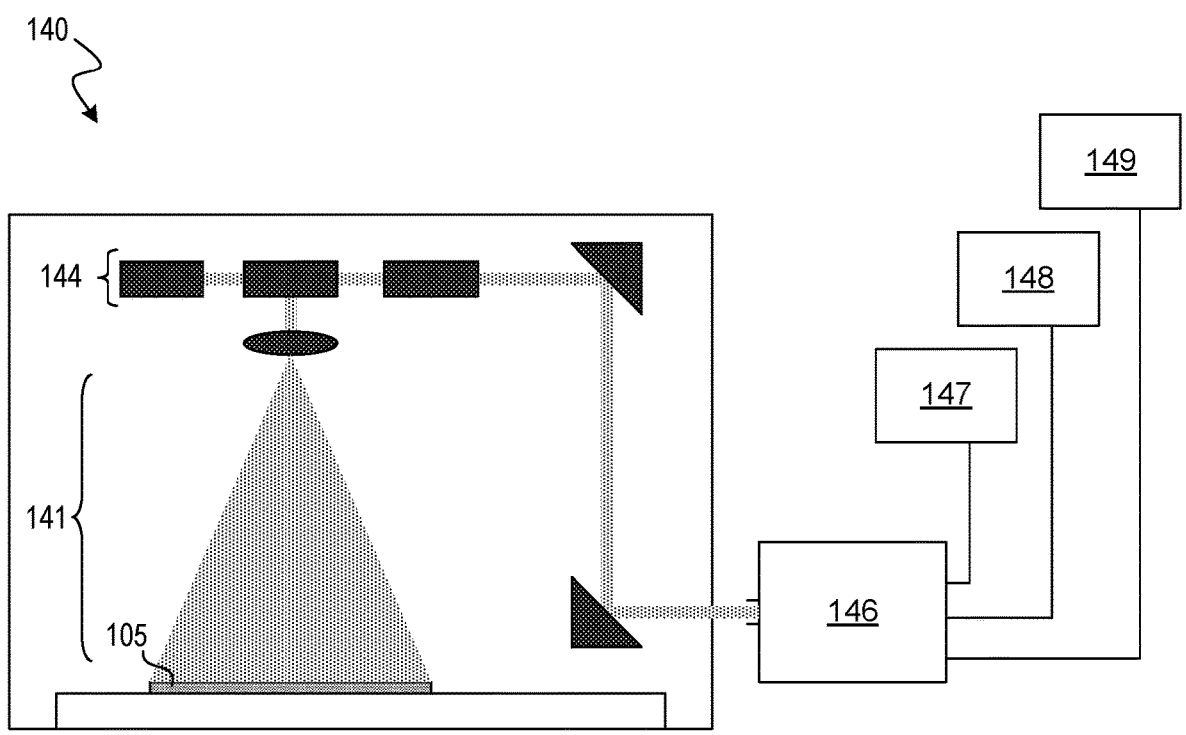
FIG. 3 is a schematic view of an example mask-based photolithographic exposure system used with embodiments herein.
Figure 4:
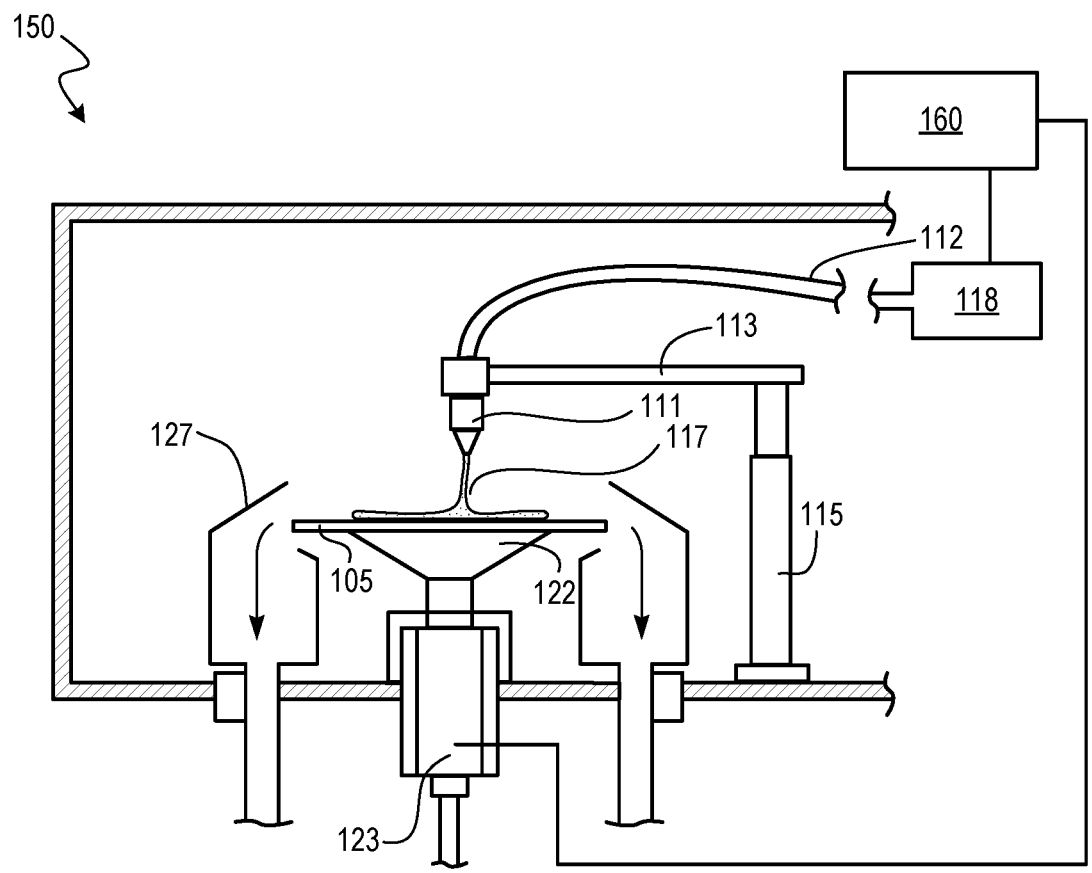
FIG. 4 is a cross-sectional schematic view of an example dispense system used with embodiments herein.

Substrates are then transferred to a exposure system 140 (FIG. 3), which can be a mask-based photolithographic exposure system (such as a stepper or scanner). Substrates can then be exposed, developed, etched and stripped via coater-developer module 150 (FIG. 4). The mask-based exposure dose can optionally be reduced by an amount allocated to the direct write exposure.

The exposure system 140 can have a higher spatial resolution as compared to the direct write system 130. Exposure system 140 can include optics 144 receiving light from light source 146 to project pattern 141, which can be a mask-based pattern. Input 147, input 148, and input 149 can include various gases, such as ArF, $N_2$, and helium for use by a given laser light source. Such exposures systems are conventionally known and so only a simplified description is provided here.

Conventional mask-based systems commonly use 193 nm wavelength light, which can print feature sizes down to about 50 nm. Not all direct write systems can achieve that resolution or achieve that resolution efficiently. Resolutions of direct write systems can be limited to sizes of micro mirrors or beam sizes. Techniques herein, however, combine both exposure systems to provide a combination maskless dynamic exposure and a mask-based pattern exposure to correct repeated patterns without measuring every substrate.

In embodiments in which multiple wavelength exposures occur, photoresist films can be formed that are sensitive to a first wavelength for the direct write exposure and yet sensitive to a second wavelength for a remaining or full mask-based exposure. Moreover, a type of agent sensitive to the radiation can optionally be selected to generate either an acid or a base on light exposure and/or be thermally sensitive so that the heat of white light or infrared, for example, can activate. Any combinations of actinic radiation can be used between the two exposure systems. Example wavelengths for combination exposures include 172 nm, 193 nm, 248 nm, 256 nm 365 nm, white light, and infrared light.

A substrate can be coated with a photoresist film using coater-developer module 150 as a system for dispensing liquid on a substrate 105. Substrate holder 122 is configured to hold substrate 105 and rotate substrate 105 about an axis. Motor 123 can be used to rotate the substrate holder 122 at a selectable rotational velocity. A dispense unit 118 is configured to dispense liquid on a working surface of the substrate 105 while the substrate 105 is being rotated by the substrate holder 122. Dispense unit 118 can be positioned directly over a substrate holder, or can be positioned at another location. If positioned away from the substrate holder, than a conduit 112 can be used to deliver fluid to the substrate. The fluid can exit through nozzle 111. FIG. 4 illustrates liquid 117 being dispensed onto a working surface of substrate 105. Collection system 127 can then be used to catch or collect excess liquid 117 that spins off substrate 105 during a given dispense operation.

Dispense components can include nozzle arm 113 as well as support member 115, which can be used to move a position of nozzle 111 across the substrate 105, or to be moved away from the substrate holder 122 to a resting location, such as for rest upon completion of dispense operations. The dispense unit 118 can alternatively be embodied as a nozzle itself. Such a nozzle can have one or more valves in communication with system controller 160. The dispense unit 118 can have various embodiments configured to control dispense of a selectable volume of fluid on a substrate, and to dispense combination of fluids.

A given photoresist film dispensed on the substrate can have various compositions for activation capability. For example, one resist can include a mixed blend in which a single dispense operation dispenses two or more photoresist compositions that provide sensitivities at multiple wavelengths. Another option is an overcoat in which a photoresist film is a multilayer film built from two dispense operations, and each film can be sensitive to different wavelengths. In another example, a topcoat-forming dispense is used in which a single dispense operation deposits a photoresist composition that builds or forms two layers of photoresist by separation of the composition after being dispensed onto the substrate surface. Each of the two layers can be sensitive to different wavelengths. Another embodiment can include depositing a single photoresist composition that remains as a single layer but that is sensitive to multiple wavelengths of light.

For embodiments herein, one or more different photo reactive agents can be selected for use. Photo reactive agents can include a photo acid generator (PAG), a thermal acid generator (TAG), and a photo destructive base (PDB). Various light source combinations can be used herein such as a lamp, ion laser (infrared, visible, 364 nm), solid state laser (infrared, visible light), and excimer laser (172 nm, 193 nm, 248 nm). Accordingly, as can be appreciated, many different combinations of light sources, photo reactive agents, and resist compositions can be used with the dual exposure system herein.

One example embodiment includes a method for patterning a substrate. A composite critical dimension signature is received or otherwise obtained. This composite critical dimension signature characterizes multiple substrates that have been processed with a specific photolithographic exposure process. These substrates can be all processed within a single lot or day, or can be selected from substrates across multiple time periods and systems, identified by specific modules within a platform, et cetera. The specific photolithographic exposure process includes a mask-based photolithographic exposure. For example, this process can include substrates processed on a specific scanner or stepper using a same photomask. The composite critical dimension signature has been created by measuring critical dimensions from the multiple substrates having been processed with the specific photolithographic exposure process and identifying repeated critical dimension values, for example, at spatial locations across the multiple substrates. The composite critical dimension signature can identify a critical dimension variation pattern that has been repeated across the multiple substrates. The specific exposure process can also include development and etching steps completed prior to measuring for CDs. Substrates for measurement can be selected from a same tool, or across multiple tools of a same type. For example, substrates are measured from a single immersion scanner for correction with that single immersion scanner. Alternatively, substrates are measured across multiple immersion scanners that all are printing a common pattern.

A substrate is received to be processed with the specific photolithographic exposure process (for example, using a specific immersion scanner tool). Thus, after a composite critical signature is identified, subsequent substrates to be processed a same way are received for processing. The substrate is coated with a photoresist film.

A first pattern of actinic radiation is projected onto the photoresist film. The first pattern of actinic radiation is projected using a maskless projection system. The first pattern of actinic radiation is created using the composite critical dimension signature. In other words, a correction image is created based on the composite critical dimension signature. This correction image spatially maps areas or point locations on the substrate to project more or less radiation to compensate for less or more radiation received from the mask-based exposure system. With areas identified on the substrate that are expected to have CDs out of a desired measurement, these areas can be pre-exposed to augment a subsequent scanner exposure. A direct write system with independently addressable projection points can scan/project the correction image onto the photoresist film, which activates more or less photo active agents depending on an intensity or amount of actinic radiation received at each point location.

The substrate can then be transferred to a mask-based photolithography system. The substrate is received after having been processed with the specific photolithographic exposure process that includes the mask-based photolithographic exposure. The mask-based photolithographic exposure is a second pattern of actinic radiation projected onto the photoresist film.

The substrate is developed to remove portions of the photoresist film that are soluble from the first pattern of actinic radiation and from the second pattern of actinic radiation. Each pattern of actinic radiation can activate same or different photo active agents to have additive solubility changes in a same layer or across two or more layers. Accordingly either a single developer can be used or multiple developers if two different films require different developing chemicals for material removal.

In other embodiments the photoresist film includes a first photo-reactive agent that reacts to a first light wavelength, and a second photo-reactive agent that reacts to a second light wavelength. Coating the substrate with a photoresist film can include depositing a first photoresist layer that includes the first photo-reactive agent, and subsequently depositing a second photoresist layer on the first photoresist layer. The second photoresist layer includes the second photo-reactive agent. In another embodiment, a self-separating photoresist mixture is deposited in which the second photo-reactive agent migrates to an upper portion of the photoresist film while the first photo-reactive agent migrates to a lower portion of the photoresist film. In another embodiment, the first photo-reactive agent is selected from the group consisting of photo acid generator (PAG), thermal acid generator (TAG), and photo destructive base (PDB), and the second photo-reactive agent is selected from the group consisting of photo acid generator (PAG), thermal acid generator (TAG), and photo destructive base (PDB). Coating the substrate with a photoresist film can include depositing a combination of a first photoresist and a second photoresist in a single dispense operation.

In one embodiment, the second pattern of actinic radiation can require a predetermined exposure dose for creating a latent pattern within the photoresist film in that the first pattern of actinic radiation is projected with an exposure dosage that is 0.1% to 5% of the predetermined exposure dose of the second pattern of actinic radiation. Alternatively, projecting the first pattern of actinic radiation includes calculating a total exposure dosage for creating a latent image within the photoresist film and projecting 0.1% to 7% of the total exposure dosage using the maskless projection system in that the mask-based photolithographic exposure is executed with a remaining portion of the total exposure dosage.

Projecting the first pattern of actinic radiation can include projecting a relatively greater dose of actinic radiation on substrate locations identified as having undersized features, and projecting a relatively lesser dose of actinic radiation on substrate locations identified as having oversized features. Projecting the first pattern of actinic radiation can include using a light source that is selected from the group consisting of lamp, ion laser, solid-state laser, and excimer laser. Projecting the first pattern of actinic radiation can include projecting actinic radiation having a wavelength selected from the group consisting of 172 nm, 193 nm, 248 nm, 256 nm, 365 nm, white light, and infrared, and wherein the specific photolithographic exposure process includes delivering actinic radiation having a wavelength selected from the group consisting of 172 nm, 193 nm, 248 nm, 256 nm, 365 nm, white light, and infrared.

Projecting the first pattern of actinic radiation can include using a first wavelength of electromagnetic radiation that is longer as compared to a second wavelength of electromagnetic radiation that is used in the mask-based photolithographic exposure. Projecting the first pattern of actinic radiation can occur within a coater-developer system while the mask-based photolithographic exposure can occur within a masked-based photolithography system. In some embodiments, processing the substrate with the specific photolithographic exposure process that includes the mask-based photolithographic exposure can occur subsequent to projecting the first pattern of actinic radiation onto the photoresist film. Projecting the first pattern of actinic radiation can include using a micro-mirror projection system configured to vary an amount of actinic radiation projected by point location on the substrate.

Another example embodiment includes a method for patterning a substrate. A composite critical dimension signature is received that characterizes multiple substrates having been processed with a specific photolithographic exposure process. The specific photolithographic exposure process includes a mask-based photolithographic exposure. The composite critical dimension signature has been created by measuring critical dimensions from the multiple substrates and identifying repeated critical dimension values at respective coordinate locations. A substrate is received to be processed with the specific photolithographic exposure process. The substrate is coated with a photoresist film. A first pattern of actinic radiation is projected onto the photoresist film using a maskless projection system. The first pattern of actinic radiation is created using the composite critical dimension signature. A second pattern of actinic radiation is projected onto the photoresist film using the specific photolithographic exposure process that includes the mask-based photolithographic exposure. The photoresist film is developed to remove portions of the photoresist film that are soluble resulting from the first pattern of actinic radiation and from the second pattern of actinic radiation. Projecting a first pattern of actinic radiation onto the photoresist film can occur prior to projecting the second pattern of actinic radiation onto the photoresist film. Likewise, projecting a first pattern of actinic radiation onto the photoresist film can occur subsequent to projecting the second pattern of actinic radiation onto the photoresist film.

Accordingly, two different types of exposures are used to create latent patterns with better CD uniformity as compared to a single exposure and without measuring every substrate to create individual correction signatures. CDs can be corrected then with high throughput.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
receiving a composite critical dimension signature that characterizes a set of multiple substrates having been processed with a specific photolithographic exposure process that includes a mask-based photolithographic exposure, the composite critical dimension signature having been created by measuring critical dimensions from each of the multiple substrates and identifying repeated critical dimension values that repeat at respective coordinate locations across the set of multiple substrates;
receiving a substrate to be processed with the specific photolithographic exposure process;
coating the substrate with a photoresist film;
projecting a first pattern of actinic radiation onto the photoresist film, the first pattern of actinic radiation being projected using a maskless projection system, the first pattern of actinic radiation being created using the repeated critical dimension values of the composite critical dimension signature;
transferring the substrate to be processed to a system for performing the specific photolithographic exposure process that includes the mask-based photolithographic exposure:
receiving the substrate to be processed from the system after the system has processed the substrate with the specific photolithographic exposure process including the mask-based photolithographic exposure as a second pattern of actinic radiation projected onto the photoresist film, and
developing the substrate to remove portions of the photoresist film that are soluble resulting from the first pattern of actinic radiation and from the second pattern of actinic radiation.

2. The method of claim 1, wherein the photoresist film includes a first photo-reactive agent that reacts to a first light wavelength, and a second photo-reactive agent that reacts to a second light wavelength.

3. The method of claim 2, wherein coating the substrate with the photoresist film includes depositing a first photoresist layer that includes the first photo-reactive agent, and subsequently depositing a second photoresist layer on the first photoresist layer, the second photoresist layer including the second photo-reactive agent.

4. The method of claim 2, wherein coating the substrate with the photoresist film includes depositing a self-separating photoresist mixture in which the second photo-reactive agent migrates to an upper portion of the photoresist film while the first photo-reactive agent migrates to a lower portion of the photoresist film.

5. The method of claim 2, wherein the first photo-reactive agent is selected from the group consisting of photo acid generator (PAG), thermal acid generator (TAG), and photo destructive base (PDB), and wherein the second photo-reactive agent is selected from the group consisting of photo acid generator (PAG), thermal acid generator (TAG), and photo destructive base (PDB).

6. The method of claim 1, wherein coating the substrate with the photoresist film includes depositing a combination of a first photoresist and a second photoresist in a single dispense operation.

7. The method of claim 1, wherein the second pattern of actinic radiation requires a predetermined exposure dose for creating a latent pattern within the photoresist film, and wherein the first pattern of actinic radiation is projected with an exposure dosage that is 0.1% to 5% of the predetermined exposure dose of the second pattern of actinic radiation.

8. The method of claim 1, wherein projecting the first pattern of actinic radiation includes calculating a total exposure dosage for creating a latent image within the photoresist film and projecting 0.1% to 7% of the total exposure dosage using the maskless projection system; and wherein the mask-based photolithographic exposure is executed with a remaining portion of the total exposure dosage.

9. The method of claim 1, wherein the composite critical dimension signature identifies a critical dimension variation pattern that has been repeated across the set of multiple substrates.

10. The method of claim 1, wherein projecting the first pattern of actinic radiation includes projecting a relatively greater dose of actinic radiation on substrate locations identified as having undersized features, and projecting a relatively lesser dose of actinic radiation on substrate locations identified as having oversized features.

11. The method of claim 1, wherein projecting the first pattern of actinic radiation includes using a light source that is selected from the group consisting of lamp, ion laser, solid-state laser, and excimer laser.

12. The method of claim 1, wherein projecting the first pattern of actinic radiation includes projecting actinic radiation having a wavelength selected from the group consisting of 172 nm, 193 nm, 248 nm, 256 nm, 365 nm, white light, and infrared, and wherein the specific photolithographic exposure process includes delivering actinic radiation having a wavelength selected from the group consisting of 172 nm, 193 nm, 248 nm, 256 nm, 365 nm, white light, and infrared.

13. The method of claim 12, wherein projecting the first pattern of actinic radiation includes using a first wavelength of electromagnetic radiation that is longer as compared to a second wavelength of electromagnetic radiation that is used in the mask-based photolithographic exposure.

14. The method of claim 1, wherein projecting the first pattern of actinic radiation occurs within a coater-developer system while the mask-based photolithographic exposure occurs within a masked-based photolithography system.

15. The method of claim 1, wherein transferring the substrate to be processed with the specific photolithographic exposure process that includes the mask-based photolithographic exposure occurs subsequent to projecting the first pattern of actinic radiation onto the photoresist film.

16. The method of claim 1, wherein transferring the substrate to be processed with the specific photolithographic exposure process that includes the mask-based photolithographic exposure occurs prior to projecting the first pattern of actinic radiation onto the photoresist film.

17. The method of claim 1, wherein projecting the first pattern of actinic radiation includes using a micro-mirror projection system configured to vary an amount of actinic radiation projected by point location on the substrate.

18. A method for patterning a substrate, the method comprising:
receiving a composite critical dimension signature that characterizes a set of multiple substrates having been processed with a specific photolithographic exposure process that includes a mask-based photolithographic exposure, the composite critical dimension signature having been created by measuring critical dimensions from each of the multiple substrates and identifying repeated critical dimension values that repeat at respective coordinate locations across the set of multiple substrates;
receiving a substrate to be processed with the specific photolithographic exposure process;
coating the substrate with a photoresist film;
projecting a first pattern of actinic radiation onto the photoresist film, the first pattern of actinic radiation being projected using a maskless projection system, the first pattern of actinic radiation being created using the repeated critical dimension values of the composite critical dimension signature;
projecting a second pattern of actinic radiation onto the photoresist film, the second pattern of actinic radiation being projected using the specific photolithographic exposure process that includes the mask-based photolithographic exposure; and
developing the photoresist film to remove portions of the photoresist film that are soluble resulting from the first pattern of actinic radiation and from the second pattern of actinic radiation.

19. The method of claim 18, wherein projecting the first pattern of actinic radiation onto the photoresist film occurs prior to projecting the second pattern of actinic radiation onto the photoresist film.

20. The method of claim 18, wherein projecting the first pattern of actinic radiation onto the photoresist film occurs subsequent to projecting the second pattern of actinic radiation onto the photoresist film.

* * * * *